United States Patent
Wang et al.

[11] Patent Number: 6,117,737
[45] Date of Patent: Sep. 12, 2000

[54] REDUCTION OF A HOT CARRIER EFFECT BY AN ADDITIONAL FURNACE ANNEAL INCREASING TRANSIENT ENHANCED DIFFUSION FOR DEVICES COMPRISED WITH LOW TEMPERATURE SPACERS

[75] Inventors: Jyh-Haur Wang; Boon-Khim Liew, both of Hsin-chu, Taiwan

[73] Assignee: Taiwan Semiconductor Manufacturing Company, Hsin-Chu, Taiwan

[21] Appl. No.: 09/246,895

[22] Filed: Feb. 8, 1999

[51] Int. Cl.$^7$ .............................................. H01L 21/8234
[52] U.S. Cl. ........................................... 438/275; 438/530
[58] Field of Search ..................................... 438/200, 275, 438/305, 306, 307, 308, 529, 530

[56] References Cited

U.S. PATENT DOCUMENTS

| | | | |
|---|---|---|---|
| 5,225,357 | 7/1993 | Ho | 437/30 |
| 5,559,050 | 9/1996 | Alsmeier et al. | 437/45 |
| 5,670,391 | 9/1997 | Lim et al. | 437/25 |
| 5,719,079 | 2/1998 | Yoo et al. | 438/238 |
| 5,792,684 | 8/1998 | Lee et al. | 438/238 |
| 5,837,572 | 11/1998 | Gardner et al. | 438/199 |
| 5,946,573 | 8/1999 | Hsu | 438/275 |

OTHER PUBLICATIONS

Nayak et al., "A Comprehensive Study of Performance and Reliability of P, As, and Hybrid AS/P nLDD Junctions for Deep–Submicron CMOS Logic Technology", IEEE Electron Device Letters, vol. 18, No. 6, Jun. 1997, pp. 281–283.

*Primary Examiner*—Chandra Chaudhari
*Attorney, Agent, or Firm*—George O. Saile; Stephen B. Ackerman

[57] ABSTRACT

A process for fabricating an I/O device, comprised with an LDD source/drain region, featuring a graded dopant profile, and simultaneously fabricating a core device, comprised with an LDD source/drain region, featuring a sharp dopant profile, has been developed. The process features the initial creation of the I/O device, LDD source/drain region, via an ion implantation procedure, followed by a furnace anneal procedure, to initiate transient enhanced diffusion, resulting in a graded dopant profile, for the I/O device, LDD source/drain region. The graded dopant profile, affords reduced risk of hot carrier effects, prevalent with the higher voltage, I/O devices. The creation of the core device, LDD source/drain region, is next addressed via another ion implantation, followed by a RTA procedure, used to activate the implanted species, and to create an LDD source/drain region, for the core device, featuring a sharp dopant profile, needed for performance objectives. The creation of insulator spacers, on the sides of the gate structures, is followed by the formation of heavily doped source/drain regions, for both I/O, and core devices.

25 Claims, 3 Drawing Sheets

REDUCTION OF A HOT CARRIER EFFECT BY AN ADDITIONAL FURNACE ANNEAL INCREASING TRANSIENT ENHANCED DIFFUSION FOR DEVICES COMPRISED WITH LOW TEMPERATURE SPACERS

RELATED PATENT APPLICATION

"REDUCTION OF A HOT CARRIER EFFECT PHENOMENA VIA USE OF TRANSIENT ENHANCED DIFFUSION PROCESSES", by J. H. Wang, of Taiwan Semiconductor Manufacturing Corp., invention disclosure number TSMC98-522, assigned to a common assignee.

BACKGROUND OF THE INVENTION (1) Field of the Invention

The present invention relates to a process sequence used to simultaneously fabricate a first device type, comprised with features directed at improved reliability, and a second type of device, comprised with features directed at enhanced performance.

(2) Description of the Prior Art

The use of high voltage, input/output, (I/O), devices, along with core devices, which operate at a lower voltage than the I/O device counterparts, both located on a single semiconductor chip, has led to design compromises, regarding reliability and performance. To realize maximum performance, the core devices are fabricated featuring short channel regions. The use of the performance enhancing short channel regions, for the core devices, require such features as heavier channel doping, anti-punchthrough implant regions, and shallow, abrupt, source/drain regions. However the I/O devices, operating at higher voltages than the core device counterparts, benefit, in terms of reducing hot carrier effects, (HCE), via the use of a non-sharp, source/drain region, featuring a graded dopant profile. To obtain the graded dopant profile, needed to reduce hot carrier reliability phenomena, prominent with the higher operating voltages used by the I/O devices, transient enhanced diffusion, (TED), of the ion implanted species, used for the lightly doped source/drain, (LDD), region, is needed. However another important factor to be considered is the lack of diffusion, or the fixed position, of ion implanted species, after being subjected an anneal cycle, such as the activation anneal cycle, used for the LDD implanted ions. Therefore the graded LDD dopant profile, of the I/O device, has to be formed prior to anneal cycles used to activate implanted species, used for the core device. Therefore to simultaneously fabricate I/O, and core devices, on a single semiconductor chip, and to create the LDD regions, needed for reliability of the I/O device, and for performance of the core device, a novel process sequence is needed.

This invention will describe a process sequence, in which the desired sharp dopant profile, needed for the LDD of the core device, and the graded, less abrupt dopant regions, needed for the LDD, I/O devices, are realized. This is accomplished by initially ion implanting the I/O, LDD region, followed by a furnace anneal, resulting in the desired graded, LDD profile, then followed by the ion implantation of the core device LDD region, and a subsequent activation anneal. Prior art, such as an article titled, "A Comprehensive Study of Performance and Reliability of P, As and Hybrid As/P n LDD Junctions for Deep-Submicron CMOS Logic Technology", by Nayak et al, in IEEE ELECTRON DEVICE LETTERS, Vol. 18, No. 6, June 1997, describes a method in which the LDD is fabricated using both arsenic and phosphorous, to enhance performance, and preserve reliability. That prior art however, does not show the process described in this invention, in which both I/O and core devices, are simultaneously created, each exhibiting the desired dopant profile, achieved via the initial creation of the graded dopant regions of the I/O devices, followed by the fabrication of the core device, featuring a sharp, or abrupt, LDD region.

SUMMARY OF THE INVENTION

It is an object of this invention to simultaneously, on the same semiconductor substrate, fabricate core devices, featuring LDD regions with sharp dopant profiles, and I/O devices, featuring LDD regions with graded dopant profiles.

It is another object of this invention to initially fabricate the I/O devices, via a first ion implantation procedure, followed by a furnace anneal, to create the LDD region, with the graded dopant profile.

It is still another object of this invention to fabricate an LDD region, for the core device, after fabrication of the I/O LDD region, via a second ion implantation procedure, followed by a RTA anneal, creating the core LDD region, featuring a sharp dopant profile.

In accordance with the present invention, a semiconductor fabrication sequence is described, featuring a furnace anneal procedure, used after an ion implantation procedure, used to create an LDD region, with a graded dopant profile, for I/O devices, followed by the fabrication of an LDD region, with a sharp dopant profile, for a core device. After formation of insulator capped, gate structures, on a thin gate insulator layer, a first ion implantation procedure, is applied in an area of a semiconductor substrate to be used for I/O devices. A furnace anneal is next used to provide the needed transient enhanced diffusion to create an LDD region, with a graded dopant profile, needed to reduce the hot carrier effects that can be encountered at the high operating voltages, used for I/O device. A second ion implantation procedure is then performed in a region of the semiconductor substrate to be used for core devices. A first RTA procedure is then used to activate the implanted ions, creating the LDD region, for the core devices, featuring a sharp dopant profile. Insulator spacers are next formed on the sides of all insulator capped, gate structures. The LDD regions, of the core device, are not influenced by the thermal excursions of the insulator spacer deposition, as a result of experiencing the first RTA procedure. A third ion implantation procedure, and a second RTA procedure, are next used to create the heavily doped source/drain regions, for both the core, and I/O devices.

BRIEF DESCRIPTION OF THE DRAWINGS

The object and other advantages of this invention, are best described in the preferred embodiment with reference to the attached drawings that include.

DESCRIPTION OF THE PREFERRED EMBODIMENTS

The method of simultaneously fabricating core devices, with sharp LDD dopant profiles, needed to achieve optimum performance, and I/O devices, featuring a more graded LDD dopant profile, needed to reduce reliability exposures, will now be described in detail. This invention will be shown for N channel, (NFET), metal oxide semiconductor field effect transistors, (MOSFET), devices, however if desired this invention can be applied to P channel, (PFET), devices, as well.

Figure 1:
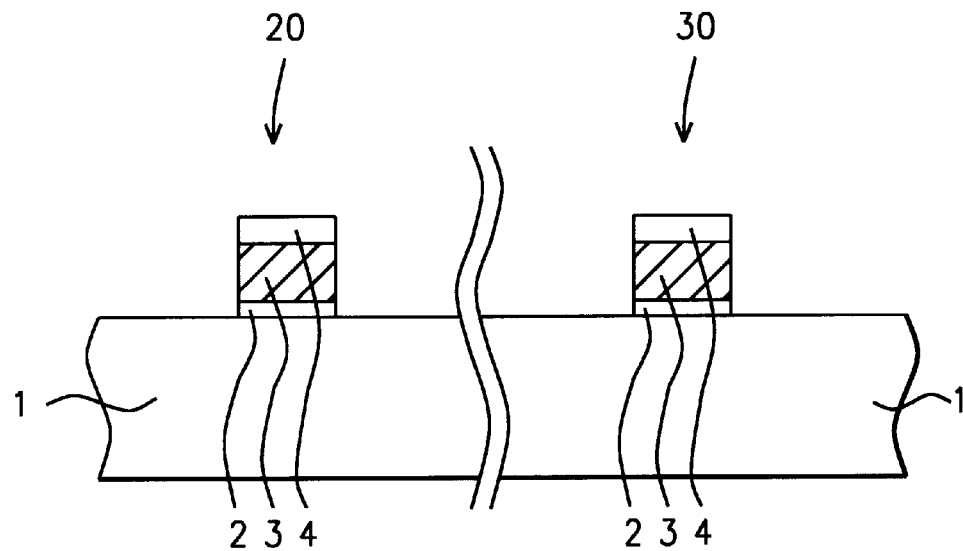
FIGS. 1–7, which schematically, in cross-sectional style, show the key stages of fabrication, used to create core devices, with sharp LDD dopant profiles, and I/O devices, with graded LDD dopant profiles.

A P type semiconductor substrate 1, comprised of single crystalline silicon, with a <100>crystallographic orientation, is used and schematically shown in FIG. 1. Region 20, of semiconductor substrate 1, will be used for I/O device fabrication, while region 30, will be used for fabrication of core devices. A silicon dioxide, gate insulator layer 2, is thermally grown, in an oxygen—steam ambient, at a temperature between about 700 to 1000° C., to a thickness between about 10 to 90 Angstroms. Insulator capped, gate structures, schematically shown in FIG. 1, in both core device region 30, and in I/O device region 20, are next created. The insulator capped, gate structures feature either a doped polysilicon gate structure 3, or a polycide, (metal silicide—polysilicon), gate structure 3. The polysilicon layer, used for the polysilicon gate structure option, is obtained via low pressure chemical vapor deposition, (LPCVD), at a thickness between about 1000 to 3000 Angstroms. The polysilicon layer is either doped in situ, during deposition, via the addition of arsine, or phosphine, to a silane ambient, or the polysilicon layer is deposited intrinsically, than doped via ion implantation of arsenic or phosphorous ions. The polycide layer, of the polycide gate structure, used if lower word line resistance is desired, is obtained via deposition of an underlying, in situ doped, polysilicon layer, via LPCVD procedures, at a thickness between about 1000 to 2000 Angstroms, followed by the deposition of a metal silicide layer, such as tungsten silicide, via LPCVD procedures, at a thickness between about 1000 to 2000 Angstroms. An insulator layer 4, such as silicon oxide, or silicon nitride, is deposited on the underlying polysilicon, or polycide layer, via LPCVD or plasma enhanced chemical vapor deposition, (PECVD), procedures, at a thickness between about 100 to 900 Angstroms. Conventional photolithographic and RIE procedures, using $CHF_3$ as an etchant for insulator layer 4, and using $Cl_2$ as an etchant for polysilicon, or polycide layer 3, are used to create the insulator capped, gate structures, shown schematically in FIG. 1. Removal of the photoresist shape, used as a mask for definition of the insulator capped, gate structures, is accomplished via plasma oxygen ashing and careful wet cleans. The wet cleans result in the removal of gate insulator 2, in regions in which gate insulator 2, is not covered by the insulator capped, gate structures.

Figure 2:
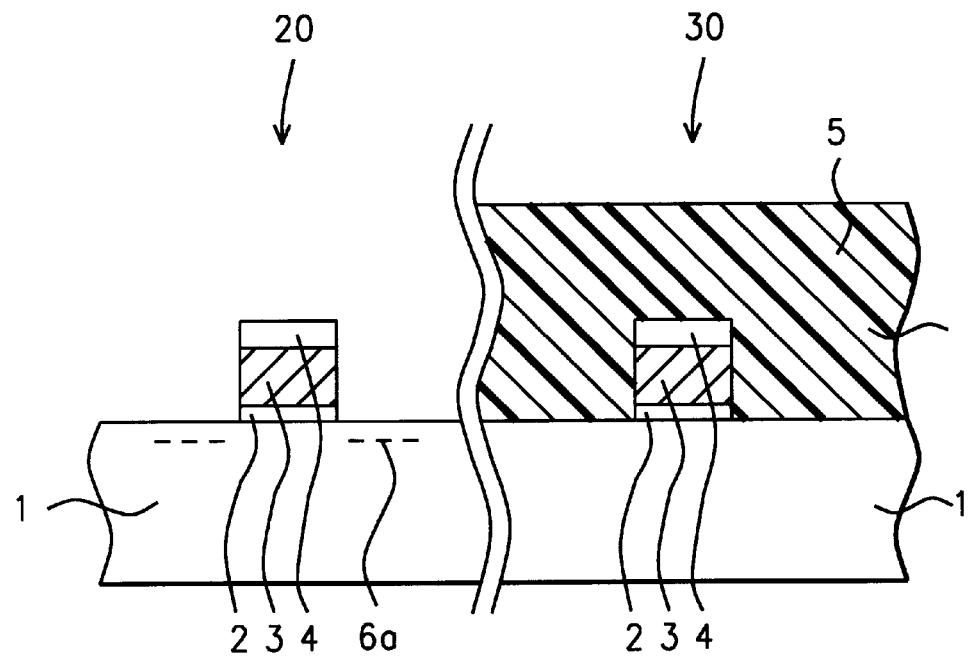
Figure 3:
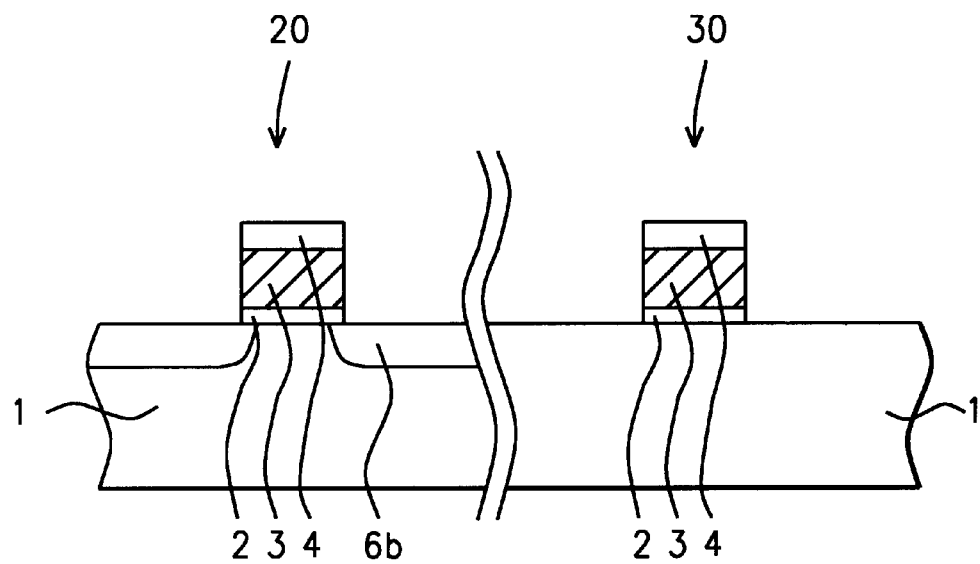

Photoresist shape 5, shown schematically in FIG. 2, is used as a mask, to allow a first ion implantation procedure to be performed only in I/O device region 20. The first ion implantation procedure, performed using arsenic or phosphorous ions, at an energy between about 5 to 50 KeV, at a dose between about 1E13 to 1E14 atoms/cm$^2$, results in the creation of unactivated LDD region 6a, in I/O device region 20, shown schematically in FIG. 2. After removal of photoresist shape 5, via plasma oxygen ashing and careful wet cleans, a critical furnace anneal is performed, at a temperature between about 650 to 850° C., for a time between about 1 to 600 min., in a nitrogen ambient. The wide range for anneal time and temperature is used to insure the transient enhanced diffusion effect, in addition to satisfying high throughput, or production considerations. The furnace anneal procedure, provides the transient enhanced diffusion, needed to create LDD region 6b, for the I/O devices, with LDD region 6b, featuring a graded dopant profile, shown schematically in FIG. 3. The position of the furnace anneal, in the process sequence is critical. If the furnace anneal step was delayed to a point in the process in which the core LDDs were already formed, the RTA procedure, used to activate the ion implanted species of the core LDD region, would fix, or set, the ion implanted species, in the I/O device LDD region, restricting the movement or diffusion of implanted ions, during a subsequent furnace anneal procedure. Therefore the graded dopant profile, needed by the I/O devices to reduce reliability exposures at high operating voltages, would not be attainable, at that point in the fabrication sequence.

Figure 4:
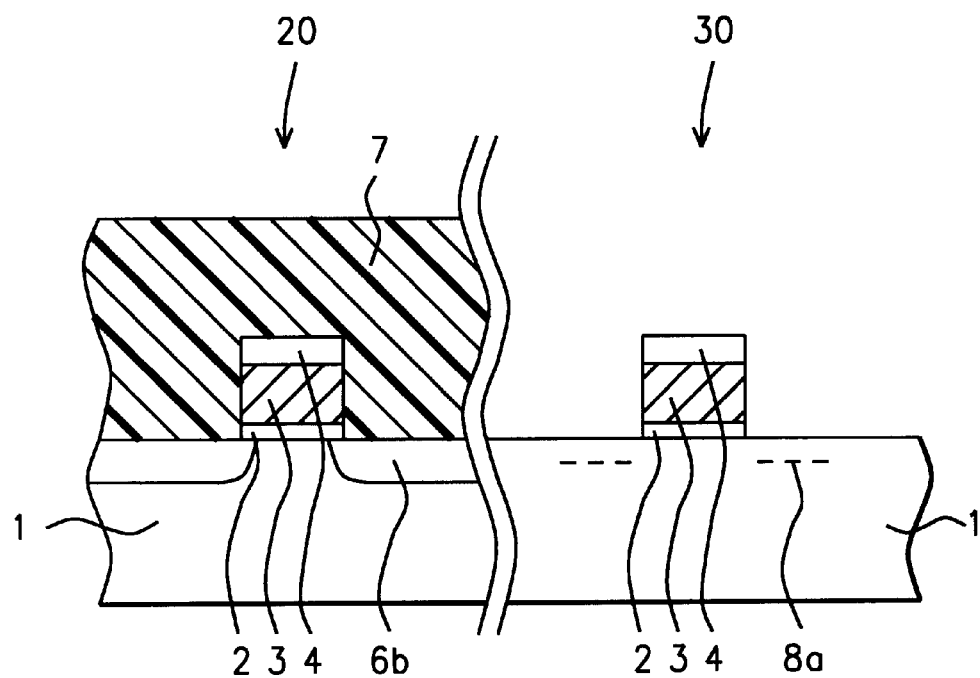

Photoresist shape 7, is next used as a block out mask, to allow a second ion implantation procedure, to create unactivated, LDD region 8a, in core device region 30, shown schematically in FIG. 4. The second ion implantation procedure is performed using arsenic or phosphorous ions, at an energy between about 0.5 to 10 KeV, at a dose between about 1E14 to 1E15 atoms/cm$^2$. Photoresist shape 7, is removed via plasma oxygen ashing and careful wet cleans.

Figure 5:
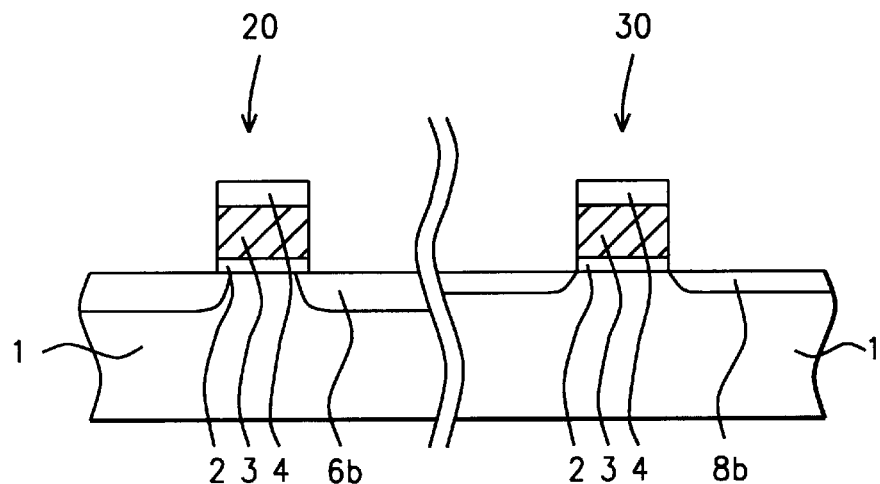

A first rapid thermal anneal, (RTA), procedure, is next performed to activate the ion implanted species 8a, creating core device LDD region 8b, schematically shown in FIG. 5. The RTA procedure is performed at a temperature between about 900 to 1050° C., for a time between about 1 to 30 sec., in a nitrogen ambient, resulting in the sharp dopant profile, for LDD region 8b, needed for performance purposes. The operating voltage used with the core devices is lower than the operating voltages experienced by I/O device counterparts, therefore the sharp dopant profile, of LDD region 8b, does not present a hot carrier effect, reliability risk.

Figure 6:
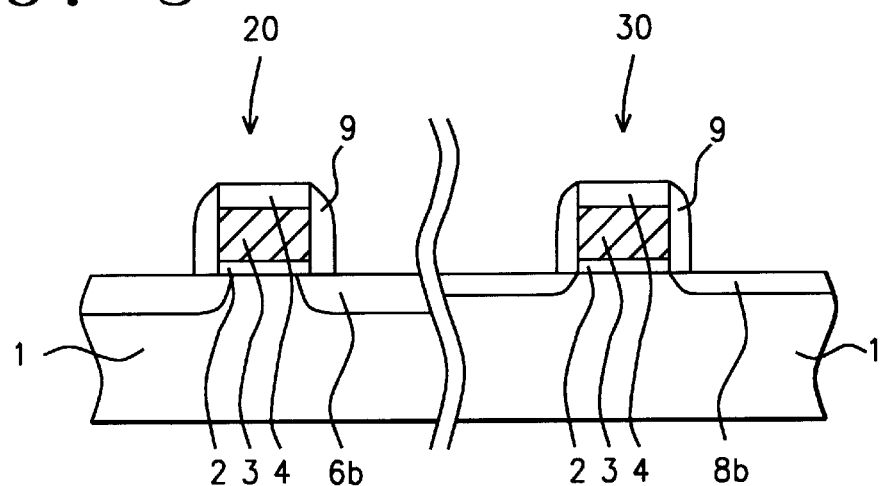

Insulator spacers 9, comprised of either silicon oxide, or silicon nitride, are next formed on the sides of the insulator capped, gate structures, and shown schematically in FIG. 6. First a layer of silicon oxide, or silicon nitride, at a thickness between about 200 to 2000 Angstroms, is deposited, using LPCVD or PECVD, procedures, at a temperature between about 350 to 850°, for a time between about 1 to 600 min. The effect of the previously performed, first RTA procedure, allows the sharp dopant profile, of the core LDD region, to be unaffected during the deposition procedure, preserving the desired dopant profiles, and performance aspects, of the core devices. An anisotropic RIE procedure, using an etchant chosen from a group that includes $SF_6$, $CF_4$, $CHF_3$, or $C_2F_6$, results in the formation of insulator spacers 9, on the sides of the insulator capped, gate structures.

Figure 7:
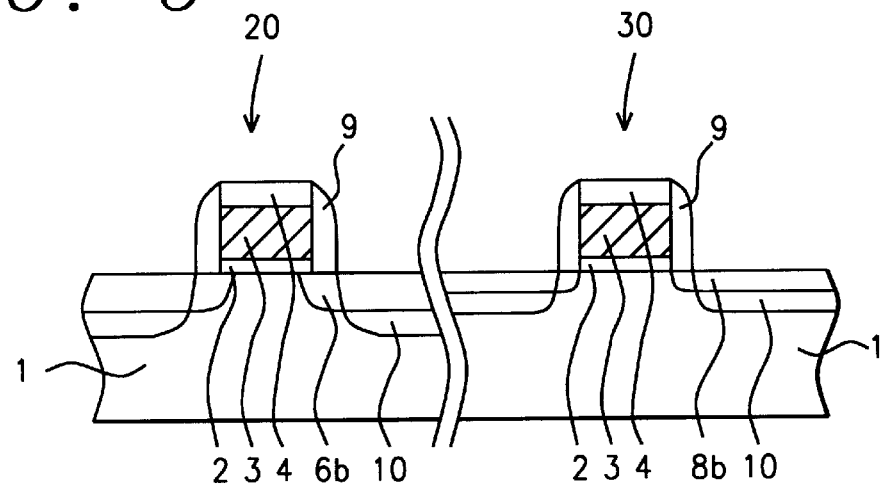

Finally a third ion implantation procedure, is used to create heavily doped source/drain regions 10, in areas of both the core device region 30, and the I/O device region 20, not covered by insulator capped, gate structures or by the insulator spacers. Heavily doped source/drain regions 10, shown schematically in FIG. 7, are formed via ion implantation of arsenic or phosphorous ions, at an energy between about 1 to 40 KeV, at a dose between about 1E15 to 6E15 atoms/cm$^2$. A second RTA procedure, performed at a temperature between about 900 to 1050° C., for a time between about 1 to 30 sec, in a nitrogen ambient, is next employed to activate the dopants in the heavily doped source/drain regions, resulting in the desired result of core devices, featuring sharp, or ungraded LDD regions 8b, needed for performance, and the less sharp, or graded, LDD regions 6b, of the higher voltage, I/O device region 20, needed to reduce reliability risks encountered with sharper dopant profiles.

While this invention has been particularly shown and described with reference to the preferred embodiments thereof, it will be understood by those skilled in the art that various changes in form and details may be made without departing from the spirit and scope of this invention.

What is claimed is:

1. A method of fabricating an input/output, (I/O), device, and a core device, on a semiconductor substrate, comprising the steps of:

forming a first gate structure, on a gate insulator layer, on a first region of said semiconductor substrate, used for said I/O device, and forming a second gate structure, on said gate insulator layer, on a second region of said semiconductor substrate, used for said core device;

ion implanting a first conductivity imparting dopant, into an area of said first region of said semiconductor substrate, not covered by said first gate structure;

performing a furnace anneal procedure, creating a lightly doped source/drain region, for said I/O device, in said first region of said semiconductor substrate;

ion implanting a second conductivity imparting dopant, into an area of said second region of said semiconductor substrate, not covered by said second gate structure;

performing a first RTA procedure, to activate said second conductivity imparting dopant, creating a lightly doped source/drain region, for said core device, in said second region of said semiconductor substrate;

forming insulator spacers, on the sides of said first gate structure, and on the sides of said second gate structure ion implanting a third conductivity imparting dopant, into an area of said first region of said semiconductor substrate, not covered by said first gate structure, or by said insulator spacers, located on the sides of said first gate structures, and into an area of said second region of said semiconductor substrate, not covered by said second gate structure, or by said insulator spacers, located on the sides of said second gate structures; and performing a second RTA procedure, activating said third conductivity imparting dopants, creating a heavily doped source/drain region, for said I/O device, in said first region of said semiconductor substrate, and creating a heavily doped source/drain region, for said core device, in said second region of said semiconductor substrate.

2. The method of claim 1, wherein said gate insulator layer is a silicon dioxide layer, thermally grown, in an oxygen—steam ambient, to a thickness between about 10 to 90 Angstroms, at a temperature between about 700 to 1000° C.

3. The method of claim 1, wherein said first gate structure, and said second gate structure, can be insulator capped gate structures, wherein said insulator layer can be a silicon oxide layer, or a silicon nitride layer, both obtained via LPCVD or PECVD procedures, at a thickness between about 100 to 900 Angstroms.

4. The method of claim 1, wherein said first gate structure, and said second gate structure, are polysilicon gate structures, formed via deposition of a polysilicon layer, using LPCVD procedures, at a thickness between about 1000 to 3000 Angstroms, doped in situ during deposition, via the addition of arsine, or phosphine, to a silane ambient, and patterned via an anisotropic RIE procedure, using $Cl_2$ as an etchant.

5. The method of claim 1, wherein said first gate structure, and second gate structure are polycide gate structures, formed via deposition of an underlying, polysilicon layer, using LPCVD procedures, at a thickness between about 1000 to 2000 Angstroms, and via deposition of an overlying tungsten silicide layer, using LPCVD procedures, at a thickness between about 1000 to 2000 Angstroms, then patterned via an anisotropic RIE procedure, using $Cl_2$ as an etchant.

6. The method of claim 1, wherein said first conductivity imparting dopant is arsenic, or phosphorous, ion implanted at an energy between about 5 to 50 KeV, and at a dose between about 1E13 to 1E14 atoms/$cm_2$.

7. The method of claim 1, wherein said furnace anneal, used to create the lightly doped source/drain region, for said I/O device, is performed at a temperature between about 650 to 850° C., for a time between about 1 to 600 min., in a nitrogen ambient.

8. The method of claim 1, wherein said second conductivity imparting dopant is arsenic, or phosphorous, ion implanted at an energy between about 0.5 to 10 KeV, at a dose between about 1E14 to 1E15 atoms/$cm^2$.

9. The method of claim 1, wherein said first RTA procedure, used to activate said second conductivity imparting dopant, and to create the lightly doped source/drain region, for said core device, is performed at a temperature between about 900 to 1050° C., for a time between about 1 to 30 sec., in a nitrogen ambient.

10. The method of claim 1, wherein said insulator spacers are formed from a silicon oxide layer, obtained via LPCVD or PECVD procedures, at a temperature between about 350 to 850° C., to a thickness between about 200 to 2000 Angstroms, followed by an anisotropic RIE procedure, using $CHF_3$ as an etchant.

11. The method of claim 1, wherein said third conductivity imparting dopant is arsenic or phosphorous, ion implanted at an energy between about 1 to 40 KeV, at a dose between about 1E15 to 6E15 atoms/$cm^2$.

12. The method of claim 1, wherein said second RTA procedure, used to activate said third conductivity imparting dopant, and to create the heavily doped source/drain regions for said I/O device, and for said core memory device, is performed at a temperature between about 900 to 1050° C., for a time between about 1 to 30 sec., in a nitrogen ambient.

13. A method of simultaneously fabricating an I/O device, comprised with an LDD source/drain region, featuring a graded dopant profile, and a core device, comprised with an LDD source/drain region, featuring a sharp dopant profile, comprising the steps of:

forming a first insulator capped, gate structure, on a silicon dioxide gate insulator layer, in a first region of a semiconductor substrate, used for said I/O device, and forming a second insulator capped, gate structure, on said silicon dioxide gate insulator layer, in a second region of said semiconductor substrate, used for said core device;

ion implanting a first conductivity imparting dopant, into an area of said I/O device, not covered by said first insulator capped, gate structure;

performing a furnace anneal to distribute said first conductivity imparting dopant, and to create said LDD source/drain region, with said graded dopant profile, for said I/O device;

ion implanting a second conductivity imparting dopant, into an area of said core device, not covered by said second insulator capped, gate structure;

performing a first RTA procedure, to activate said second conductivity imparting dopant, and to create said LDD source/drain region, with said sharp dopant profile, for said core device;

depositing an insulator layer;

performing an anisotropic RIE procedure, on said insulator layer, to create insulator spacers on the sides of said first insulator capped, gate structure, and on the sides of said second insulator capped, gate structure;

ion implanting a third conductivity dopant, into an area of said I/O device, not covered by said first insulator capped, gate structure, or by said insulator spacers, and into an area of said core device, not covered by said second insulator capped, gate structure, or by said insulator spacers; and performing a second RTA procedure, activating said third conductivity imparting dopants, creating a heavily doped source/drain region, for said I/O device, and creating a heavily doped source/drain region, for said core device.

14. The method of claim 13, wherein said silicon dioxide gate insulator layer, is formed at a thickness between about 10 to 90 Angstroms, via a thermal oxidation procedure, performed in an oxygen—steam ambient, at a temperature between about 700 to 1000° C.

15. The method of claim 13, wherein the capping insulator layer used for said first insulator capped, gate structure, and for said second insulator capped, gate structure, is either a silicon oxide layer, or a silicon nitride layer, obtained via LPCVD or PECVD procedures, at a thickness between about 100 to 900 Angstroms.

16. The method of claim 13, wherein said first insulator capped, gate structure, and said second insulator capped, gate structure, are polysilicon gate structures, formed via deposition of a polysilicon layer, using LPCVD procedures, at a thickness between about 1000 to 3000 Angstroms, followed by a patterning procedure, performed via an anisotropic RIE procedure, using $Cl_2$ as an etchant.

17. The method of claim 13, wherein said first insulator capped, gate structure, and said second insulator capped, gate structure, are polycide gate structures, formed via deposition of an underlying polysilicon layer, using LPCVD procedures, at a thickness between about 1000 to 2000 Angstroms, and via deposition of an overlying tungsten silicide layer, using LPCVD procedures, at a thickness between about 1000 to 2000 Angstroms, then patterned via an anisotropic RIE procedure, using $Cl_2$ as an etchant.

18. The method of claim 13, wherein said first conductivity imparting dopant is arsenic or phosphorous, ion implanted at an energy between about 5 to 50 KeV, at a dose between about 1E13 to 1E14 atoms/$cm^2$.

19. The method of claim 13, wherein said furnace anneal procedure, used to create said LDD source/drain region, with a graded dopant profile, for said I/O device, is performed at a temperature between about 650 to 850° C., for a time between about 1 to 600 min., in a nitrogen ambient.

20. The method of claim 13, wherein said second conductivity imparting dopant is arsenic or phosphorous, ion implanted at an energy between about 0.5 to 10 KeV, at a dose between about 1E14 to 1E15 atoms/$cm^2$.

21. The method of claim 13, wherein said first RTA procedure, used to create said LDD source/drain region, with a sharp dopant profile, is performed at a temperature between about 900 to 1050° C., for a time between about 1 to 30 sec., in a nitrogen ambient.

22. The method of claim 13, wherein said insulator layer, used for said insulator spacers, is a silicon oxide layer, at a thickness between about 200 to 2000 Angstroms, obtained via LPCVD or PECVD procedures, at a temperature between about 350 to 850° C.

23. The method of claim 13, wherein said insulator spacers, are formed via an anisotropic RIE procedure, applied to said insulator layer, using an etchant chosen from a group which includes, $SF_6$, $CF_4$, $CHF_3$, and $C_2F_6$.

24. The method of claim 13, wherein said third conductivity imparting dopant is arsenic, or phosphorous, ion implanted at an energy between about 1 to 40 KeV, at a dose between about 1E15 to 6E15 atoms/$cm^2$.

25. The method of claim 13, wherein said second RTA procedure, used to activate said third conductivity imparting dopant, creating said heavily doped source/drain region, for said I/O device, and for said core device, is performed at a temperature between about 900 to 1050° C., for a time between about 1 to 30 sec., in an nitrogen ambient.

* * * * *